United States Patent [19]

Kobayashi

[11] Patent Number: 5,211,804

[45] Date of Patent: May 18, 1993

[54] METHOD FOR DRY ETCHING

[75] Inventor: Motoki Kobayashi, Tokyo, Japan

[73] Assignee: Oki Electric Industry, Co., Ltd., Tokyo, Japan

[21] Appl. No.: 775,094

[22] Filed: Oct. 11, 1991

[30] Foreign Application Priority Data

Oct. 16, 1990 [JP] Japan .................. 2-275405

[51] Int. Cl.$^5$ .......................................... H01L 21/00
[52] U.S. Cl. ..................... 156/665; 156/643; 156/646; 156/662; 156/656; 156/657
[58] Field of Search .................. 156/643, 646, 659.1, 156/665, 662, 656, 657

[56] References Cited

U.S. PATENT DOCUMENTS

| | | | |
|---|---|---|---|
| 4,256,534 | 3/1981 | Levinstein et al. | 156/656 |
| 4,267,013 | 5/1981 | Iida et al. | 156/656 |
| 4,444,618 | 4/1984 | Saia et al. | 156/665 |
| 4,468,284 | 8/1984 | Nelson | 156/665 |
| 4,505,782 | 3/1985 | Jacob et al. | 156/665 |
| 4,795,529 | 1/1989 | Kawasaki et al. | 156/345 |
| 4,838,992 | 6/1989 | Abraham | 156/665 |

FOREIGN PATENT DOCUMENTS 51170536 10/1982 Japan .
59-220928 12/1984 Japan .
1-082630 3/1989 Japan .
64-82630 3/1989 Japan .

OTHER PUBLICATIONS

"Silicon Processing for the VLSI Era-vol. 1"; Wolf et al.; ©1986; Sunset Beach, Calif.; pp. 562, 581–582.
Plasma Etching of Aluminum, Dennis W. Hess, Solid State Technology/Apr. 1981 pp. 189–194.
1990 Dry Process Symposium-After Corrosion Suppression Using Low-Temperature Al-Si-Cu Etchings, pp. 141–146.

Primary Examiner—Brian E. Hearn
Assistant Examiner—George Goudreau
Attorney, Agent, or Firm—Wenderoth, Lind & Ponack

[57] ABSTRACT

A method for dry etching is disclosed which incorporates the steps of preparing a substrate having a metal film thereon in which aluminium is contained therein; generating a plasma by interacting a mixture gas consisting of a chloride gas, an oxygen gas and a nitrogen gas or a mixture of a chloride gas, a chlorine gas, an oxygen gas and a nitrogen gas with a microwave in a magnetic field, and etching the metal film in the plasma, whereby the metal film which contains aluminum can be etched without undercutting it and forming residues.

17 Claims, 5 Drawing Sheets

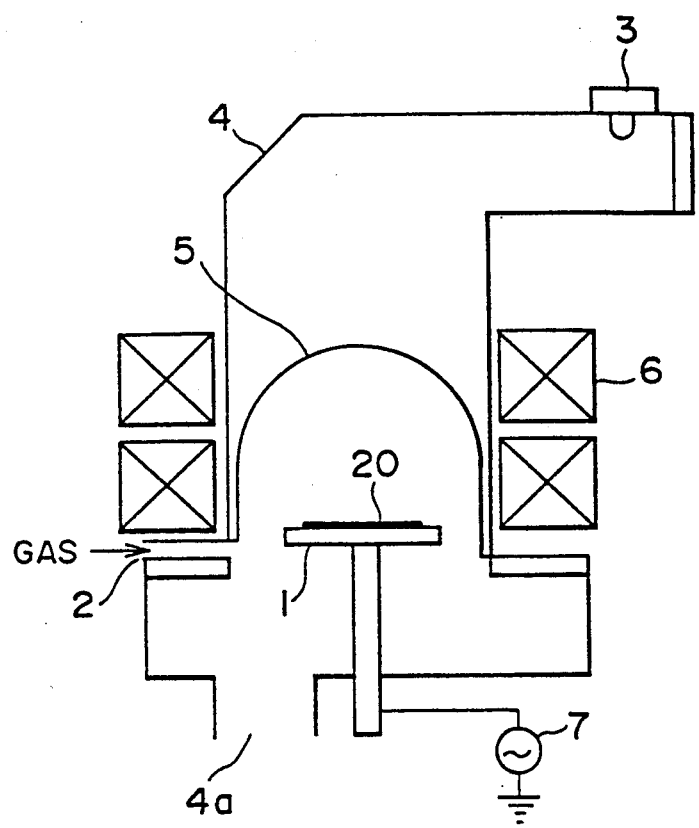
F I G. 1

METHOD FOR DRY ETCHING

BACKGROUND OF THE INVENTION

The present invention relates to a manufacturing method for a semiconductor integrated circuit, and more particularly to a dry etching method for patterning metal films which contain aluminium.

A conventional method for dry etching is, for example, disclosed in Japanese laid-open patent publication 64-82630 in which an anisotropic etching is disclosed in which ions generated in a plasma attack the surface of metal films which contain aluminium so that a chemical reaction is accelerated between the etching gas and the substrate.

SUMMARY OF THE INVENTION

It is an object of the present invention to provide a method for dry etching metal films which contain aluminium without being undercut when manufacturing a semiconductor integrated circuit in which an anisotropic etching is performed by utilizing an inorganic mask.

It is another object of the present invention to provide a method for dry etching for etching metal films which contain aluminium without forming residues.

To accomplish the above objects, there is provided a method for dry etching comprising the steps of: preparing a substrate covered by metal films containing aluminium on which an inorganic mask is formed; generating a discharging plasma by interacting a mixture gas in a magnetic field with microwave, which mixture gas consists of a chloride gas, an oxygen gas and a nitrogen gas, or a chloride gas, a chlorine gas, an oxygen gas, and a nitrogen gas; and etching the metal films containing aluminium in the discharging plasma.

BRIEF DESCRIPTION OF THE INVENTION

In the accompanying drawings, there are shown illustrative embodiments of the invention from which these and other of its objectives, novel features, and advantages will be readily apparent in which:

FIG. 1 is a constructional view of a dry etching apparatus with which the present invention is utilized;

FIGS. 2(a) and 2(b) are cross sectional views illustrating a wafer process of a substrate for which the present invention is utilized;

FIG. 6 is a view illustrating a result of etching in case mixture gas consisting of boron tri-chloride gas, chlorine gas, oxygen gas and nitrogen gas;

FIG. 7 is a graph illustrating an etching rate of an aluminium alloy film and existance of residues relative to a mixture ratio of nitrogen gas; and FIG. 8 is a graph illustrating an etching rate of an aluminium alloy film and existance of residues relative to a mixture ratio of oxigen gas.

DETAILED DESCRIPTION OF PREFERRED EMBODIMENTS

Figure 2A:
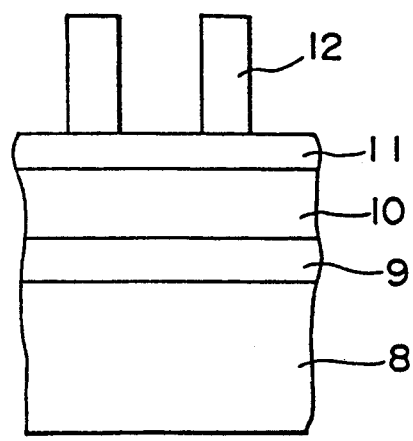

Referring to the drawings, embodiments of the invention will be hereinafter explained in detail in which the drawings are shown schematically to an extent that the invention can readily be understood.

First, an dry etching apparatus, for which the present invention is utilized, will be explained referring to FIG. 1.

The dry etching apparatus, shown in FIG. 1, is a piece by piece type of an magnetro-microwave etching apparatus for etching a substrate having a prescribed mask pattern thereon.

A substrate 20 is disposed on an electrode 1 which is disposed in a reaction chamber 5 and connected to a radio frequency power source 7.

The reaction chamber 5 incorporates a gas inlet 2 introducing an etching gas into the reaction chamber 5 and a gas outlet 4a exhausting the etching gas from the reaction chamber 5.

A wave guide 4 is coupled to a magnetron oscillator 3.

A coil 6 is disposed at a circumferential outside of the wave guide 4 corresponding to the position of the reaction chamber 5.

The operation of the dry etching apparatus will be explained hereinafter.

The magnetron oscillator 3 outputs a microwave with 2.45 GHz in frequency.

The microwave is transmitted through the waveguide 4 into the reaction chamber 5.

The coil 6 generates magnetic field with 875 G in magnetude with an electric power source being supplied.

The etching gas introduced from the gas inlet 2 is exposed to the microwave and the magnetic field so as to generate an Electron Cyclotron Resonance (ECR) plasma by being interacted, which etches the aluminium alloy films formed on the substrate 20 in the chemical chamber 5.

A radio frequency power from the radio frequency power source 7 is provided to the electrode 1 on which the substrate 20 is disposed.

The radio frequency power generates an electric field in the substrate 20, by which ions ionized in the ECR plasma attack accelerate the substrate 20 to the etching speed.

The energy of the ions attacking the substrate 20 can be controlled by adjusting the radio frequency power.

Now, an explanation will be made as to one embodiment of the dry etching method according to the present invention.

Figure 2B:
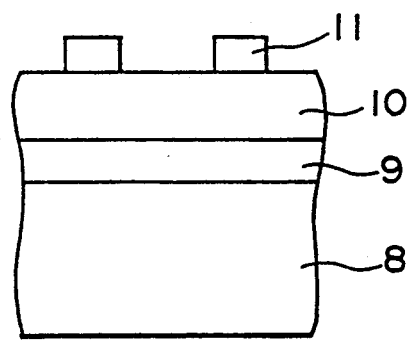

FIGS. 2(a) and 2(b) are cross sectional views illustrating a wafer process of a substrate for which the dry etching method according to the present invention is utilized.

As shown in FIG. 2(a), a silicon dioxide ($S_iO_2$) film 9 is deposited on a silicon substrate 8 by chemical vapour deposition (CVD).

Then, an Al-Si (1.0%)-Cu (0.5%) film 10 is formed on the $S_iO_2$ film 9 by sputtering.

After that, an S$_i$O$_2$ film 11 is formed by plasma CVD on the Al-Si-Cu film 10 as an inorganic mask.

Since the S$_i$O$_2$ film 11 can be formed under relatively low temperatures, the surface of the Al-Si-Cu film 10 is well protected as flat and smooth.

Further, a positive resist pattern 12 is formed on the S$_i$O$_2$ film 11 and the S$_i$O$_2$ film 11 is patterned by utilizing the positive resist pattern 12.

The patterning of the S$_i$O$_2$ film 11 is performed by reactive ion etching (RIE) utilizing a mixture gas as an etching gas consisting of carbon tetrafluoride gas, methane trifluoride gas and an argon gas.

The positive resist pattern 12 is completely removed by ashing and wet cleaning.

The patterning of the Al-Si-Cu film 10 is, in this manner, completed by the dry etching method in accordance with the present invention.

Next, an experiment for the etching gas utilized to the dry etching method in accordance with the present invention will be explained hereinafter.

There is disclosed an example method in which the Al-Si-Cu film 10 is dry etched by utilizing the S$_i$O$_2$ film 11 as a mask.

Figure 3:
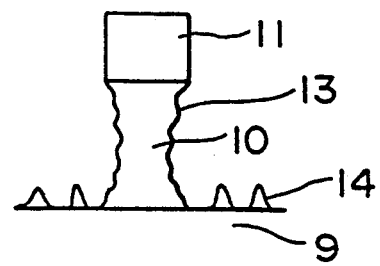
FIG. 3 is a view illustrating the result of etching using a chlorine gas.

FIG. 3 shows a dry etching result when chlorine gas is utilized as an etching gas.

This etching gas generates an undercut 13 on the side wall of the Al-Si-Cu film 10 and a lot of residues 14 on the surface of the S$_i$O$_2$ film 9.

The etching is performed under following conditions:
The flow rate of chlorine gas is 150 SCCM;
The gas pressure is 16 mtorr.;
The microwave power is 800 W;
The radio frequency power is 70 W; and
The etching time is 30 seconds.

Figure 4:
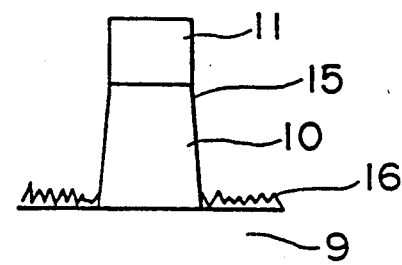
FIG. 4 is a view illustrating the result of etching using a mixture gas consisting of a chlorine gas and an oxygen gas.

FIG. 4 shows a dry etching result by utilizing mixture gas as an etching gas consisting of chlorine gas and oxygen gas.

This etching gas makes the Al-Si-Cu film 10 form a taper shaped side wall 15 and generated residues 16 to cover the whole surface of the S$_i$O$_2$ film 9.

The etching conditions mentioned above is such that the etching time is 60 seconds and the mixture ratio of the oxygen gas is 5 to 10%.

When the mixture ratio of the oxygen gas decreases, the residues are formed although in a small amount it is.

When the mixture ratio of the oxygen gas increases, the etching time increases to cause a drop in the its etching rate.

The increase of the residues and the dropping of the etching rate as a result of varying the mixture ratio of the oxygen gas is due to the oxidation of the surface of the Al-Si-Cu film 10 by the oxygen gas.

Accordingly, varying the mixture ratio of the oxygen gas can prevent the Al-Si-Cu film 10 from being undercut but can not prevent the formation of residues.

Figure 5:
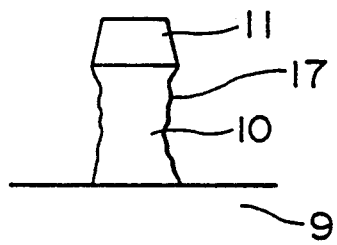
FIG. 5 is a view illustrating the result of etching using a mixture gas consisting of a boron trichloride gas, a chlorine gas and an oxygen gas.

FIG. 5 shows the dry etching results when a mixture of chlorine, oxygen and boron trichloride gases are used which etchant is essentially a chloride gas having an oxygen reducing group.

This etching gas generates an undercut 17 on the side wall of the Al-Si-Cu film 10, but creates surface of the S$_i$O$_2$ film 9 free from the residues.

The boron trichloride gas accelerates the reducing reaction so that the etching rate to the S$_i$O$_2$ film 9 increases.

However, the mixture gas consisting of boron trichloride gas, chlorine and oxygen gas requires a high radio frequency power with approximately 150 Watts being supplied to the substrate 20 when the mixture gas is utilized as an etching gas.

The use of the high radio frequency power, however, causes an increase in the etching rate for the S$_i$O$_2$ film 11 used as a mask, whereby the shape of the Al-Si-Cu film 10 is deteriorated.

Figure 6:
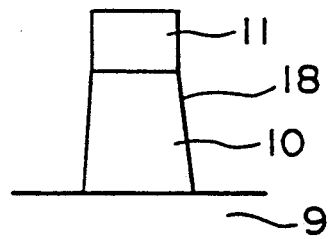
FIG. 6 is a view illustrating the result of etching using a mixture gas consisting of a boron trichloride gas, a chlorine gas, an oxygen gas and a nitrogen gas.

FIG. 6 shows the dry etching results when a mixture gas is utilized as an etching gas consisting of boron trichloride, chlorine, oxygen and nitrogen nitrogen gas.

By using this etching gas, the shape of the Al-Si-Cu film 10 reveals no undercut but a taper shaped side wall 15 is formed.

Further, no residue remains on the surface of the S$_i$O$_2$ film 9.

The use of nitrogen gas in the mixture increases the dissociation of radicals and ionization of ions in the plasma so that the etching rate for the Al-Si-Cu film 10 increases.

Further, the residues on the surface of the S$_i$O$_2$ film 9 can be easily removed.

The optimum mixture ratios of nitrogen gas and oxygen have been gas investigated with respect to the mixture gas consisting of boron trichloride chlorine, oxygen and nitrogen.

Figure 7:
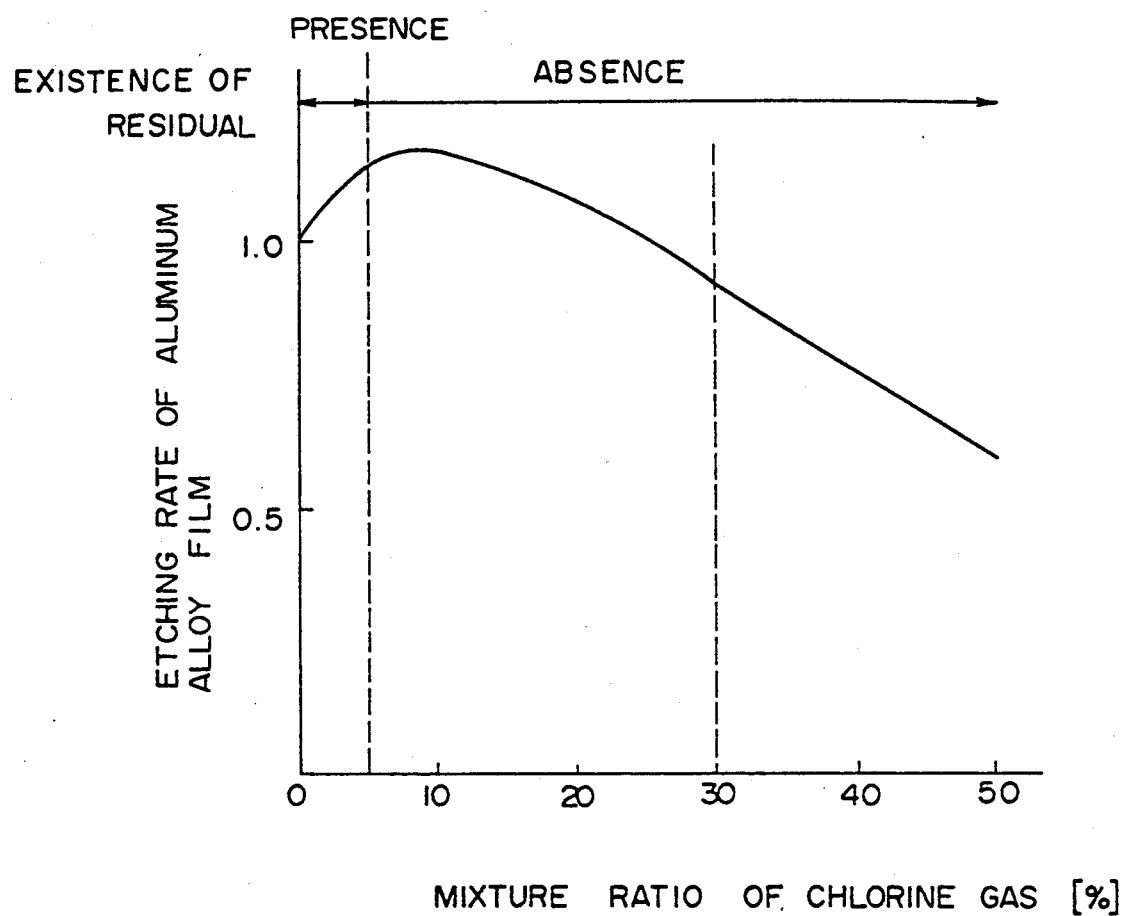
FIG. 7 is a graph illustrating the etching rate of an aluminum alloy film and the existence of residues relative to the mixture ratio of nitrogen gas.

FIG. 7 is a graph illustrating etching rate of an aluminium alloy film and the existence of residues relative to the mixture ratio of the nitrogen gas.

As shown in the drawing, it is readily understood that the residual can not remain if the mixture ratio of the nitrogen gas is more than 5%.

When the mixture ratio of the nitrogen exceeds 30%, the processed pattern shape is damaged due to its low etching rate.

Eventually, the optimum mixture ratio of the nitrogen gas falls into a range of 5% to 30%.

Figure 8:
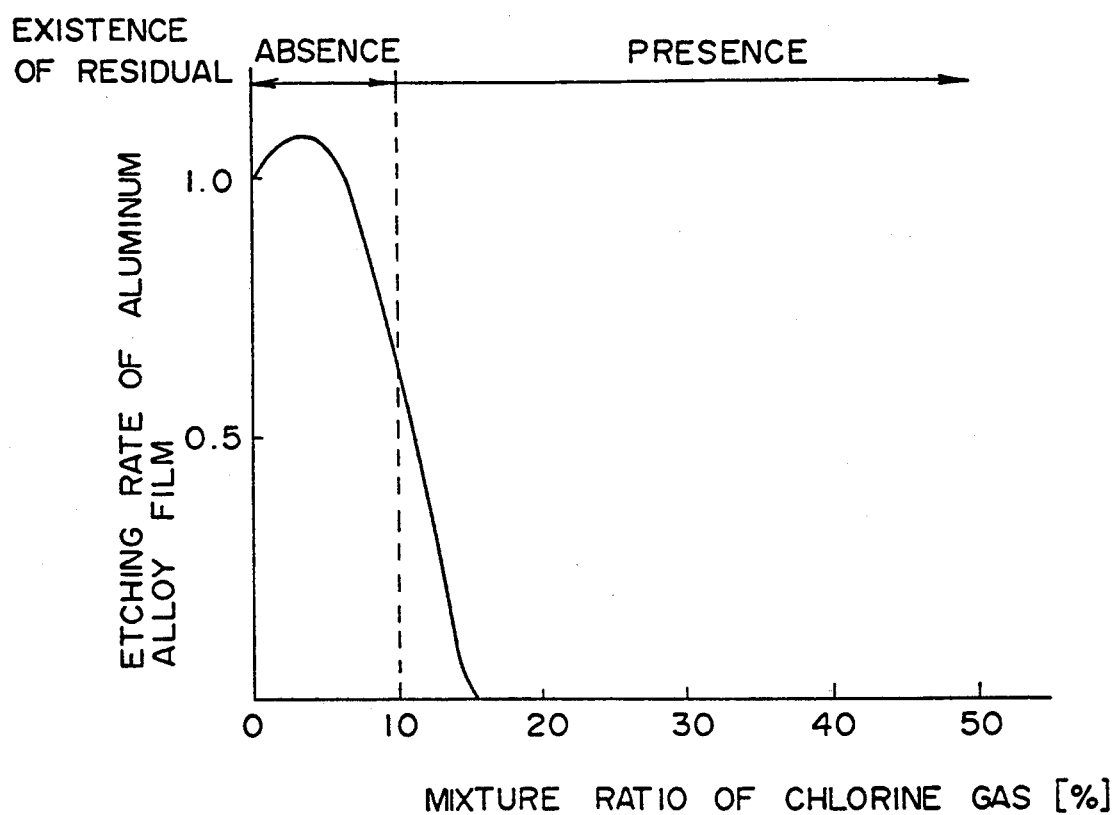
FIG. 8 is a graph illustrating the etching rate of an aluminum alloy film and existence of residues relative to the mixture ratio of oxygen gas.

FIG. 8 is a graph illustrating the etching rate of aluminium an alloy film and the existence of residues relative to the mixture ratio of the oxygen gas.

As shown in the drawing, the residues are generated if the mixture ratio of the oxygen gas exceeds 5%.

Accordingly, the optimum mixture ratio of the oxygen gas is considered to be less than 10%.

The mixture gas utilized in the present invention is not only limited to the mixture gas consisting of boron trichloride, chlorine, oxygen and nitrogen but can be expanded to the mixture gas consisting of boron trichloride gas, oxygen and nitrogen.

The chloride gas is also not limited to boron trichloride gas but can be expanded to silicon tetrachloride gas and carbon tetrachloride gas.

The metal film which contains aluminium is not limited to the Al-Si-Cu film but can also be expanded to an Al film, Al-Cu film, Al-Si film, Al-Si-Cu-H$_f$-B film and an aluminium alloy film in which other impurities are contained.

Further, the inorganic mask is not limited to the S$_i$O$_2$ film but can be expanded to an S$_i3$N$_4$ film.

I claim:

1. A method for etching a metal film containing aluminium, comprising the steps of:
   forming a metal film on a substrate;
   forming an inorganic mask on a part of the metal film, the other part of the metal film being exposed;
   introducing a mixture gas consisting essentially of a chloride gas, an oxygen gas and a nitrogen gas into a reaction chamber;
   introducing microwaves into the reaction chamber;

generating a magnetic field into the reaction chamber;

interacting the microwaves with the magnetic field to change the mixture gas into a plasma in the reaction chamber; and subjecting the substrate having the metal film and the inorganic mask thereupon to the plasma to etch the exposed metal film in the reaction chamber and to form a taper shaped side wall for the remaining metal film.

2. The method for etching set forth in claim 1, wherein a radio frequency power outputted from a radio frequency power source is provided to the substrate.

3. The method for etching set forth in claim 2, wherein the radio frequency power controls the energy of ions which attack against substrate in the plasma.

4. The method for etching set forth in claim 1, wherein the mixture ratio of the oxygen gas in the mixture gas is less than 10%.

5. The method for etching set forth in claim 1, wherein the mixture ratio of the nitrogen gas in the mixture gas is in a range of 5% to 30%.

6. The method for dry etching set forth in claim 1, wherein the inorganic mask is an $S_iO_2$ film.

7. The method for etching set forth in claim 1, wherein the chloride gas is boron trichloride gas.

8. The method for etching set forth in claim 1, wherein the metal film is an Al-Si-Cu film.

9. A method for etching a metal film containing aluminium, comprising the stops of:

forming a metal film on a substrate;

forming an inorganic mask on a part of the metal film, the other part of the metal film being exposed;

introducing a mixture gas consisting essentially of a chloride gas, a chlorine gas, an oxygen gas and a nitrogen gas into a reaction chamber;

introducing microwaves into the reaction chamber;

generating a magnetic field in the reaction chamber;

interacting the microwaves with the magnetic field to change the mixture gas to a plasma in the reaction chamber; and subjecting the substrate having the metal film and the inorganic mask to the plasma to etch the exposed metal film in the reaction chamber, and form a taper shaped side wall for the remaining metal film.

10. The method for etching set forth in claim 9, wherein a radio frequency power outputted from a radio frequency power source is provided to the substrate.

11. The method for etching set forth in claim 10, wherein the radio frequency power controls the energy of ions in the plasma which attack the substrate.

12. The method for etching set forth in claim 9, wherein the mixture ratio of the oxygen gas in the mixture gas is less than 10% but is present in an amount sufficient to etch the metal film when converted into a plasma.

13. The method for etching set forth in claim 9, wherein the mixture ratio of the nitrogen gas in the mixture gas is in a range of 5% to 30%.

14. The method for etching set forth in claim 9, wherein the inorganic mask is an $S_iO_2$ film.

15. The method for etching set forth in claim 9, wherein the chloride gas is an boron tri-chloride gas.

16. The method for dry etching set forth in claim 9, wherein the metal film is Al-Si-Cu film.

17. The method for etching set forth in claim 1 in which the mixing ratio of the oxygen gas is 5–10%.

* * * * *